(12) United States Patent
Johnson et al.

(10) Patent No.: US 6,323,665 B1
(45) Date of Patent: *Nov. 27, 2001

(54) APPARATUS CAPABLE OF HIGH POWER DISSIPATION DURING BURN-IN OF A DEVICE UNDER TEST

(75) Inventors: James E. Johnson; Ronald J. Darcy, both of Houston, TX (US)

(73) Assignee: Reliability Incorporated, Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/167,238

(22) Filed: Oct. 6, 1998

Related U.S. Application Data (60) Provisional application No. 60/061,305, filed on Oct. 7, 1997, provisional application No. 60/062,555, filed on Oct. 21, 1997, and provisional application No. 60/062,673, filed on Oct. 22, 1997.

(51) Int. Cl.[7] .................................................. G01R 31/02
(52) U.S. Cl. ........................................... 324/760; 324/765
(58) Field of Search ..................................... 324/765, 760; 165/80.3, 80.4, 104.13; 361/704, 700, 718, 699

(56) References Cited

U.S. PATENT DOCUMENTS

| | | | |
|---|---|---|---|
| 4,092,697 | 5/1978 | Spaight | 361/386 |
| 4,574,052 | 3/1986 | Bohl et al. | 126/390 |
| 4,715,438 | 12/1987 | Gabuzda et al. | 165/185 |
| 4,733,293 | 3/1988 | Gabuzda | 357/81 |
| 4,750,086 | 6/1988 | Mittal | 361/382 |
| 4,753,290 | 6/1988 | Gabuzda | 165/185 |
| 4,791,983 | 12/1988 | Nicol et al. | 165/80.4 |
| 4,839,587 * | 6/1989 | Flatley et al. | 324/760 |
| 4,851,965 | 7/1989 | Gabuzda et al. | 361/383 |
| 4,879,629 | 11/1989 | Tustaniwskyj et al. | 361/385 |
| 4,887,147 | 12/1989 | Friedman | 357/74 |
| 5,006,796 * | 4/1991 | Burton et al. | 324/760 |
| 5,086,269 | 2/1992 | Nobi | 324/158 |
| 5,162,974 | 11/1992 | Currie | 361/385 |
| 5,208,731 | 5/1993 | Blomquist | 361/386 |
| 5,241,453 | 8/1993 | Bright et al. | 361/704 |
| 5,297,621 * | 3/1994 | Taraci et al. | 165/104.13 |
| 5,307,239 | 4/1994 | McCarty et al. | 361/704 |
| 5,323,294 | 6/1994 | Layton et al. | 361/699 |
| 5,325,052 | 6/1994 | Yamashita | 324/158 |
| 5,390,129 | 2/1995 | Rhodes | 364/480 |
| 5,412,535 | 5/1995 | Chao et al. | 361/700 |
| 5,424,580 | 6/1995 | Tustaniwskyj et al. | 257/713 |
| 5,459,352 | 10/1995 | Layton et al. | 257/724 |
| 5,557,559 | 9/1996 | Rhodes | 364/580 |
| 5,561,590 | 10/1996 | Norell et al. | 361/699 |
| 5,574,626 | 11/1996 | Smith | 361/704 |
| 5,579,205 | 11/1996 | Tustaniwskyj et al. | 360/704 |
| 5,602,719 | 2/1997 | Kinion | 361/704 |

(List continued on next page.)

*Primary Examiner*—Vinh P. Nguyen
(74) *Attorney, Agent, or Firm*—Conley, Rose & Tayon, P.C.

(57) ABSTRACT

A system and method for burning-in an integrated circuit chip including at least a socket capable of receiving and supporting the chip, electrical leads in the socket for connecting to corresponding leads on the chip, and a heat sink in thermal contact with a cooling medium. The heat sink includes a thermal interface in releasable thermal contact with the integrated circuit in the socket. The heat sink removes more heat from the integrated circuit than is generated during the burn-in process and the integrated circuit is maintained within a predetermined desired temperature range by monitoring the temperature of the integrated circuit and supplying make-up heat as needed. Multiple sockets can be grouped together and cooled by a manifolded cooling system, with the temperature of each integrated circuit being individually monitored and controlled.

5 Claims, 5 Drawing Sheets

U.S. PATENT DOCUMENTS

| | | | |
|---|---|---|---|
| 5,658,831 | 8/1997 | Layton et al. | 29/832 |
| 5,671,118 | 9/1997 | Blomquist | 361/704 |
| 5,704,416 | 1/1998 | Larson et al. | 165/104.33 |
| 5,742,168 | 4/1998 | Kiyokawa et al. | 324/754 |
| 5,807,104 * | 9/1998 | Ikeya et al. | 324/765 |
| 5,821,505 | 10/1998 | Tustaniwskyj et al. | 219/494 |
| 5,847,366 | 12/1998 | Grunfeld | 219/497 |
| 5,875,096 * | 2/1999 | Gates | 361/704 |
| 5,944,093 | 8/1999 | Viswanath | 165/104.26 |

* cited by examiner

APPARATUS CAPABLE OF HIGH POWER DISSIPATION DURING BURN-IN OF A DEVICE UNDER TEST

RELATED APPLICATIONS

The present application claims the benefit of U.S. Provisional Applications Serial Nos. 60/061,305, filed Oct. 7, 1997, 60/062,555 filed Oct. 21, 1997 and 60/062,673, filed Oct. 22, 1997, which are hereby incorporated by reference in their entireties.

TECHNICAL FIELD OF THE INVENTION

The present invention relates generally to devices for burn-in and testing of integrated circuit chips (IC) and more specifically to techniques for cooling of the IC devices on the burn-in boards used to ensure that newly-manufactured chips are suitable for use. Still more particularly, the present invention comprises a socket adapted to provide improved cooling capacity and to a system for cooling the IC and socket effectively.

BACKGROUND OF THE INVENTION

It is well-known in the art of electronic device manufacturing to test, and/or "burn-in," various electronic subcomponents before assembling them into a larger device. For example, computer chips are frequently individually connected in a burn-in system for the purpose of ensuring that all of the desired electronic circuits in each chip are operational. The burn-in process accelerates aging of the chips and thus allows defective chips to be identified and discarded early in the manufacturing process. This is desirable because it allows the manufacturer to avoid the expense that would otherwise be wasted by constructing a larger, more expensive device containing the defective chip. In addition to burn-in, computer chips and other integrated circuits may be subjected to various other testing operations. The term "testing" as used herein is intended to encompass and include bum-in operations.

In a burn-in operation, each chip, integrated circuit (IC), or other electronic component, each of which is hereinafter referred to as a "device under test" or "DUT," is connected to several electronic leads. These leads typically take the form of an array of small solder buttons that are positioned to correspond to electronic leads on the under-surface of the DUT. The DUT is placed on the arrayed leads so that an electrical connection is made at each desired point.

During the burn-in or test operation, heat is generated by the passage of current via the leads through the various circuits on the DUT. Heretofore, ICs were less powerful and, correspondingly, the amount of power consumed during burn-in of a computer chip was relatively small. For this reason, the amount of heat generated was such that burn-in devices could be air-cooled in most cases. With the advent of newer, more powerful chips, the amount of heat generated during burn-in has multiplied ten-fold, from about 3–10 watts, to 30–100 watts or more.

In addition, the increasing cost of chip packaging has motivated manufacturers to advance the burn-in step so that it is carried out before, rather than after, final packaging. This allows manufacturers to save the cost of packaging a defective chip, but means that the burn-in operation must be carried out on partially packaged ICs, where the silicon die itself may be exposed. Partially packaged ICs are less robust and more susceptible to damage than fully packaged chips. Thus, the burn-in operation cannot subject the DUTs to excessive or uneven forces.

Because the burn-in must be carried out at a controlled temperature, and because the chips cannot be exposed to temperature extremes, it is imperative that the significant heat generated during burn-in be removed. Air cooling does not provide sufficient cooling without a very large heat sink. Liquid cooling, using an electrically insulating fluid has been tried, but has proven nonviable for very high power DUTs. At the same time, burning-in or testing a partially packaged chip raises new considerations over burning-in or testing a fully packaged chip. For example, partially packaged chips are not typically adapted to readily dump heat at the required rate.

It is known that high-power transistors generate comparable amounts of heat during burn-in operations. However, the configuration of transistors and conventional transistor packages is such that cooling systems that are designed for transistor burn-in devices cannot readily be adapted to cool IC devices. In addition, transistors are typically sealed within durable metal or plastic packages, so that the handling concerns that arise in the context of burning in chips do not arise in transistor burn-in devices. Furthermore, as compared to the volume of high power transistors that require testing, the volume of ICs that must be tested is so many times greater that cost factors that are not as significant in the context of transistor testing become prohibitive when contemplated in the context of chip testing.

In addition to the problems associated with providing sufficient cooling capacity to a given burn-in device and providing a heat transfer surface does not limit that capacity, problems arise from the fact that the amount of heat generated during burn-in or testing varies significantly from DUT to DUT. It has been found that in some instances, the amount of heat generated varies by as much as two orders of magnitude. This variance make it difficult to simultaneously burn-in several devices, as a cooling system that adequately cools the DUTs that generate greater amounts of heat will over-cool the DUTs that generate less heat, causing their temperatures to fall below the desired burn-in temperature range. Conversely, a cooling system that properly cools the DUTs that generate lesser amounts of heat will under-cool the DUTs that generate more heat, causing their temperatures to rise above the desired burn-in temperature range.

Hence, it is desired to provide a DUT burn-in device that is capable of simultaneously removing at least 30–100 watts of heat from each of several chips, while maintaining the temperature of each DUT within a narrow desired range. Furthermore, the preferred device should be capable of maintaining the DUTs within the prescribed temperature even though the DUTs produce amounts of heat that may vary by more than an order of magnitude and even though some DUTs may generate as little as 3 watts of heat. The preferred device should also be readily incorporated into a system capable of simultaneously processing multiple DUTs. These objectives require that the device be capable of compensating for variance in heat generation between DUTs that are being burned in simultaneously. The preferred device should be able to handle unpackaged chips without damaging them either before, during or after the burn-in process. It is further desired to provide a burn-in device that is commercially viable in terms of cost, labor and reliability.

SUMMARY OF THE INVENTION

The present invention comprises a burn-in device that is capable of simultaneously removing at least 30–100 watts of heat from each of several DUTs, while compensating for variance in heat generation between DUTs and maintaining the temperature of each chip within a narrow desired range, including DUTs producing 3 watts or more of heat. The present invention is readily incorporated into a system capable of simultaneously burning-in multiple DUTs. The preferred device causes a minimum of damage to the DUTs and is commercially viable in terms of cost, labor and reliability.

The present invention comprises a novel socket for receiving and contacting an individual chip during burn-in, and to a system for supporting and cooling several of the sockets. The socket includes a cooling system that is capable of removing at least 3 to 10 times as much heat from a chip as previous systems. The cooling system includes at least one highly thermally conductive heat sink member held in good thermal contact with the chip or device-under-test (DUT).

The present invention includes an apparatus and technique for achieving good thermal contact between the heat sink member and the DUT. The preferred apparatus provides a conformal interface that conforms to any unevenness in the upper surface of the DUT. In a first embodiment, this thermal contact is obtained via an elastomeric heat pad and a heat spreader that together form the socket lid. The elastomeric heat pad is preferably covered by a thin metal film. In another embodiment, the conformal interface comprises a low melting point metal (LMPM) contained within a skin formed from a much higher melting point metal. In a less preferred embodiment, the interface comprises an ultra-smooth, highly polished metal surface.

According to the present invention, a separate burn-in socket receives each DUT. Each socket is preferably constructed such that the biasing force that allows good thermal contact between the heat sink and the DUT is controlled and distributed across the DUT, so as to avoid mechanical damage to the DUT. The preferred socket also provides means for applying sufficient contact force between the socket base and the DUT to allow for good electrical contact, while at the same time limiting the application of compressive force to the DUT so as to avoid damaging the DUT.

A preferred embodiment of the present invention further includes a temperature sensor for monitoring and providing data on the temperature of the cooling system in the vicinity of the DUT and a heat source for applying a controlled amount of heat to the DUT in response to the output of the temperature sensor. The temperature sensor is preferably embedded in the heat spreader near the interface with the DUT. The heat source is preferably also embedded in the heat spreader. The heat source is controlled by a controller in response to the signal generated by the temperature sensor.

A preferred embodiment of the present cooling system also includes a liquid-vapor cooling system in thermal contact with the heat sink and socket. The liquid-vapor cooling system preferably includes multiple liquid-vapor ducts controlled by a single controller, resulting in significant cost and operational savings over the prior art. In another embodiment, the liquid-vapor cooling system is replaced by a circulating liquid system, known as a liquid cooling unit (LCU). The LCU allows for burn-in temperatures of less than 60° C.

BRIEF DESCRIPTION OF THE DRAWINGS

Other objects and advantages of the invention will become apparent upon reading the following detailed description and upon reference to the accompanying drawings, wherein.

It will be understood that the device described in detail below can be operated in any orientation. Thus, relative terms such as "upper," "lower," "above," and "below" refer to the various components of the invention as drawn and are used for illustration and discussion purposes only. Such terms are not intended to require these relationships in any embodiment of the invention.

DETAILED DESCRIPTION OF THE PREFERRED EMBODIMENTS

Figure 1:
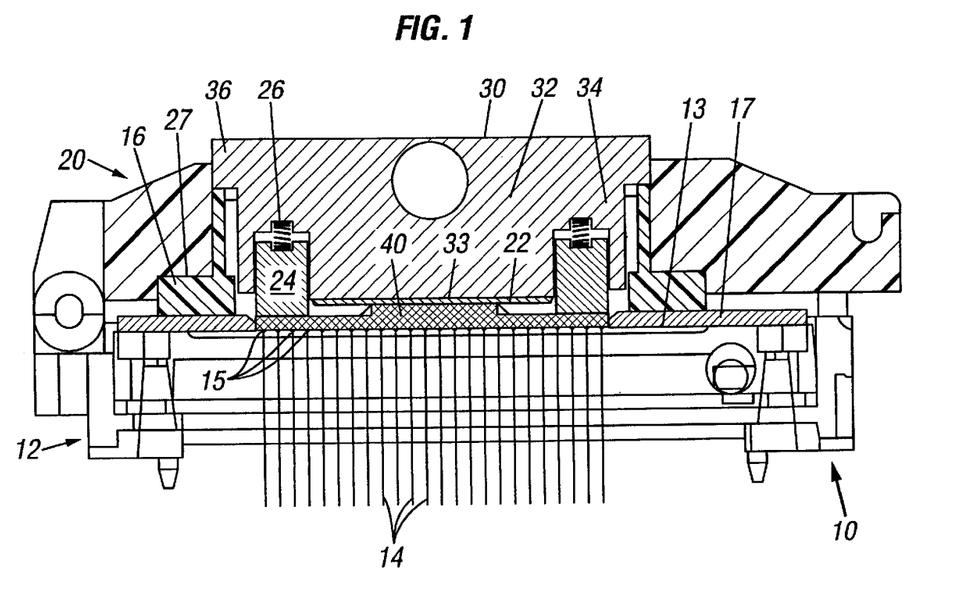
FIG. 1 is a cross-sectional view through a burn-in or test socket constructed in accordance with a first embodiment of the present invention.

Referring now to FIG. 1, one feature of the present invention comprises a burn-in or test socket 10 that meets the afore-mentioned objectives. Specifically, the present burn-in system comprises a socket 10 including a socket base 12 and a compression stop 16, which is used in conjunction with a socket lid 20, heat pad 22, pressure plates 24, springs 26 and heat spreader 30. In FIG. 1, a DUT 40 is shown received in socket 10. In some embodiments, pressure plates 24 and springs 26 may be omitted, if the socket and lid are constructed such that sufficient pressure is applied to the DUT by other means.

Socket

Socket base 12 is preferably constructed of a suitable non-conducting material such as are known in the art, and has a plurality of conducting electrical leads 14 embedded therein. Each lead 14 preferably terminates in an electrical contact 15, which may comprise a surface feature such as a solder bump on the upper surface 13 (as drawn) of socket base 12. Leads 14 are moveable into and out of engagement with the lower surface of DUT 40.

It is preferred but not necessary that the upper surface 13 of socket base 12 include a beveled lip 17 that serves to guide the DUT into position on socket base 12. Lip 17 preferably defines an area corresponding to the footprint of a DUT. This area is typically a square having an area that is slightly greater than the heat transfer area of the DUT. For example, each side of the area bounded by lip 17 may be 0.005 to 0.010 inches longer than the length of one side of the DUT. Compression stop 16 preferably extends farther above surface 13 than lip 17. Compression stop 16 preferably comprises a rigid, non-compressible material configured so as to define or correspond to the perimeter of socket base 12. In an alternative embodiment, compression stop 16 is integrally formed from the same piece as base 12. Together, base 12 and stop 16 form one part of the two-part lidded socket 10.

The other part of socket 10 is formed by socket lid 20, heat spreader 30, heat pad 22, springs 26 and pressure plates 24. These components are interconnected and move together into and out of engagement with the socket and the DUT.

Socket lid 20 is preferably made of high temperature plastic or other similar material. Socket lid 20 is adapted to bear on compression stop 16 and includes a lower surface 27 for that purpose. Heat spreader 30 has a center portion 32 having a contact surface 33 to which is affixed heat pad 22 so as to define a highly thermally conductive interface. Heat spreader 30 further includes a flange 36, which bears on compression stop 16.

Additionally, heat spreader 30 includes an intermediate shoulder 34 that supports at least two downward-extending springs 26. According to one preferred embodiment, eight springs 26 are affixed to shoulder 34 along two sides of center portion 32. At least one pressure-distributing device, such as pressure plates 24, is affixed to the opposite end of each spring 26. Pressure plates 24 can be separate from one another as shown, or can be formed as a single piece (not shown) having any desired configuration. The system comprising springs 26 and pressure plates 24 is provided for the purpose of applying a compressive force to the DUT so as to ensure that good electrical contact is maintained between the electrical contacts on the DUT and leads 14 in the socket. A variety of mechanical systems other than the springs and plates described above can be used to apply a compressive force to the DUT. Some of these alternative systems are described in detail in commonly owned application Ser. No. 09/167,295, filed concurrently herewith and entitled Burn-In Board Having Adaptable Heat Sink Device, which is incorporated herein by reference.

Heat spreader 30 is preferably constructed of any suitable rigid, highly thermally conducting material. One preferred material is copper, and more preferably copper plated with another metal, such as nickel. Springs 26 are preferably conventional small coil springs, but can be any suitably compressible biasing means. Pressure plate 24 can be any rigid material that can be provided with a very smooth surface, and is preferably polished stainless steel. It is preferred that the surface 33 of heat spreader 30 be polished to at least approximately 8 microinches.

Thermal Interface

According to the present invention, the interface between the DUT 40 and heat spreader 30 is designed so as to provide maximum heat transfer from the DUT to the heat spreader. In order to accomplish maximum heat transfer, the interface must accommodate the uneven upper surface of the DUT. Overall, the thermal interface must be conformal, thermally conducting, durable and reusable. In addition, factors such as labor, material costs and manufacturing complexity must also be considered. It is to be understood that the systems described below are merely illustrative and not exhaustive of the various systems that meet these objectives.

According to a first preferred embodiment, a heat pad 22 is affixed to the lower surface (as drawn) of center portion 32 of heat spreader 30. Heat pad 22 preferably comprises a material having a high thermal conductivity. More specifically, it is preferred that the material from which heat pad 22 is formed have a thermal conductivity of at least 0.2 BTU/ft, and more preferably at least 0.5 BTU/ft. Because the upper surface of the DUT is likely to have some irregularities, it is preferred that heat pad 22 also be somewhat conformal or resilient. A preferred category of materials can be described as thermally conductive polymeric composite materials. One preferred material that meets these criteria is a boron nitride loaded silicone elastomer sold under the trademark SIL-PAD 2000®, by the Bergquist Company of Minneapolis, Minn. SIL-PAD 2000® is preferably used in the form of a sheet having a thickness between about 4 and 20 thousandths of an inch and preferably about $5/10^3$ inch. Another preferred material is an alumina filled silicone elastomer sold under the trade name T-Flex 200 by Thermagon, Inc., 3256 West 25th Street, Cleveland, Ohio 44109. The resilient heat pad 22 is preferably provided in sheet form, with a preferred thickness for heat pad 22 being approximately 4 to 5 mils.

Because it is preferred that the surface that contacts the upper surface of the DUT leave no residue on the DUT, it is preferred to provide a thin foil coating 23 (FIG. 3A) over the resilient conductor that forms heat pad 22. Another preferred embodiment uses a 2 mil thick copper foil that is electroplated with a 50 $\mu$layer of gold. Still another preferred embodiment uses a 1 mil thick nickel foil that is electroplated with gold. Other less preferred foils include copper plated with platinum, copper plated with palladium and brass.

Figure 2:
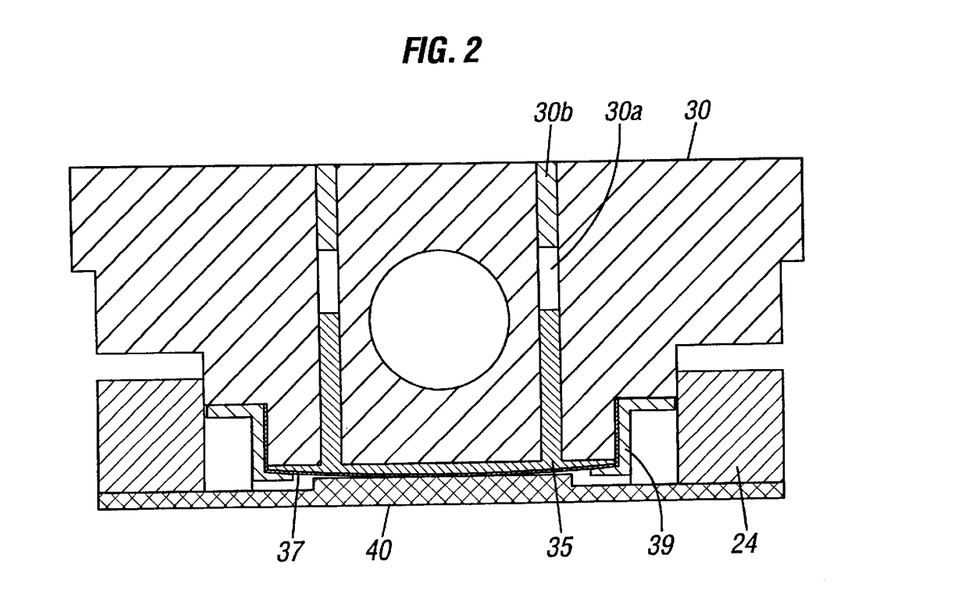
FIG. 2 is an enlarged view of an alternative embodiment of the thermal interface of the present invention.

A second preferred embodiment for the thermal interface comprises a conformal cushion formed by a low melting point metal that melts at the operating temperature of the system, as illustrated in FIG. 2. As shown, the thermal interface comprises a body 35 of low melting point metal, contained in a metal foil skin 37. Skin 37 preferably comprises 1 mil nickel foil. If desired, the skin metal can comprise a different metal, such as gold-plated copper, or can be comprise or be plated with platinum, gold or palladium. It is preferred to plate the foil with a metal that does not leave a residue or contaminate the surface of the DUT. The metal skin is preferably clamped onto and sealed to the contact surface 33 of heat spreader 30 by a retainer 39, or sealed with a solder bead (not shown). Together, the skin 37 and retainer 39, contain the LMPM 35 when it melts. In an alternative embodiment shown in FIG. 3B, the LMPM 35 is contained by skin 37 and by a gasket 38 that is clamped between skin 37 and heat spreader 30. Gasket 38 can be made of any suitable gasket material that is capable of maintaining a seal at the operating temperatures of the interface. In each case, at least one expansion port 30a is included through heat spreader 30 for allowing thermal expansion of the LMPM 35. If desired, ports 30a can be plugged with plugs 30b, as shown.

Together, the skin 37 and retainer 39, or the skin 37, gasket 38 and retainer 39, contain the LMPM when it melts. The LMPM can be any suitable LMPM, such as are known in the art. LMPM's are sometimes referred to as fusible alloys. They include alloys of bismuth with lead, tin, cadmium, gallium, and/or indium. LMPM's can be designed to have melting points within desired temperature ranges by varying the proportions of these elements. According to the present invention, the LMPM that forms the thermal interface with heat spreader 30 melts between 29° C. and 65° C.

Because the melting point of the solder bead 39 that contains the LMPM must be higher than the melting point of the LMPM, it is preferable to attach skin 37 to bead 39 before the LMPM is emplaced if the solder approach is used. Once the perimeter of skin 37 is completely sealed to contact surface 33, the desired volume of LMPM can be melted and poured or injected under the skin. This is preferably accomplished via access port 30a. After the desired volume of LMPM is in place behind skin 37, access passage is preferably sealed by any suitable means, such as solder, that is capable of remaining sealed at operating temperatures. This embodiment provides excellent heat conduction away from the DUT, as LMPMs typically have thermal conductivities of at least 100 BTU/ft, and often at least 200 BTU/ft.

Still another embodiment of the thermal interface can be constructed without using a conformal member at the interface. In this embodiment (not shown), the lower surface of heat spreader 30 is preferably covered directly with a metal foil as described above. This embodiment relies on the slight conformability of the heat sink material and foil and the relatively good heat transfer that is made possible by the elimination of a conformal member to ensure that sufficient heat is transferred from the DUT.

Thermal Compensation System

The present burn-in system is adapted to burn in DUTs having a variety of capacities. It is also known that, even within DUTs having the same specifications, a range of actual operational properties will be encountered. At the same time, the thermal tolerance of DUTs is relatively small and it is preferred that burn-in be carried out within a narrow temperature range. For example, chip manufacturers may specify that burn-in or testing be performed in the temperature range of from 60° C. to 125° C. As long as the cooling system provides a set cooling capacity for each socket, unequal heating among individual DUTs will result in uneven temperatures among the DUTs. Because the range of operational temperatures of a given set of DUTs is likely to exceed the specified burn-in temperature range, it is necessary to include a system for equalizing the temperatures across a set of DUTs.

Figure 3A:
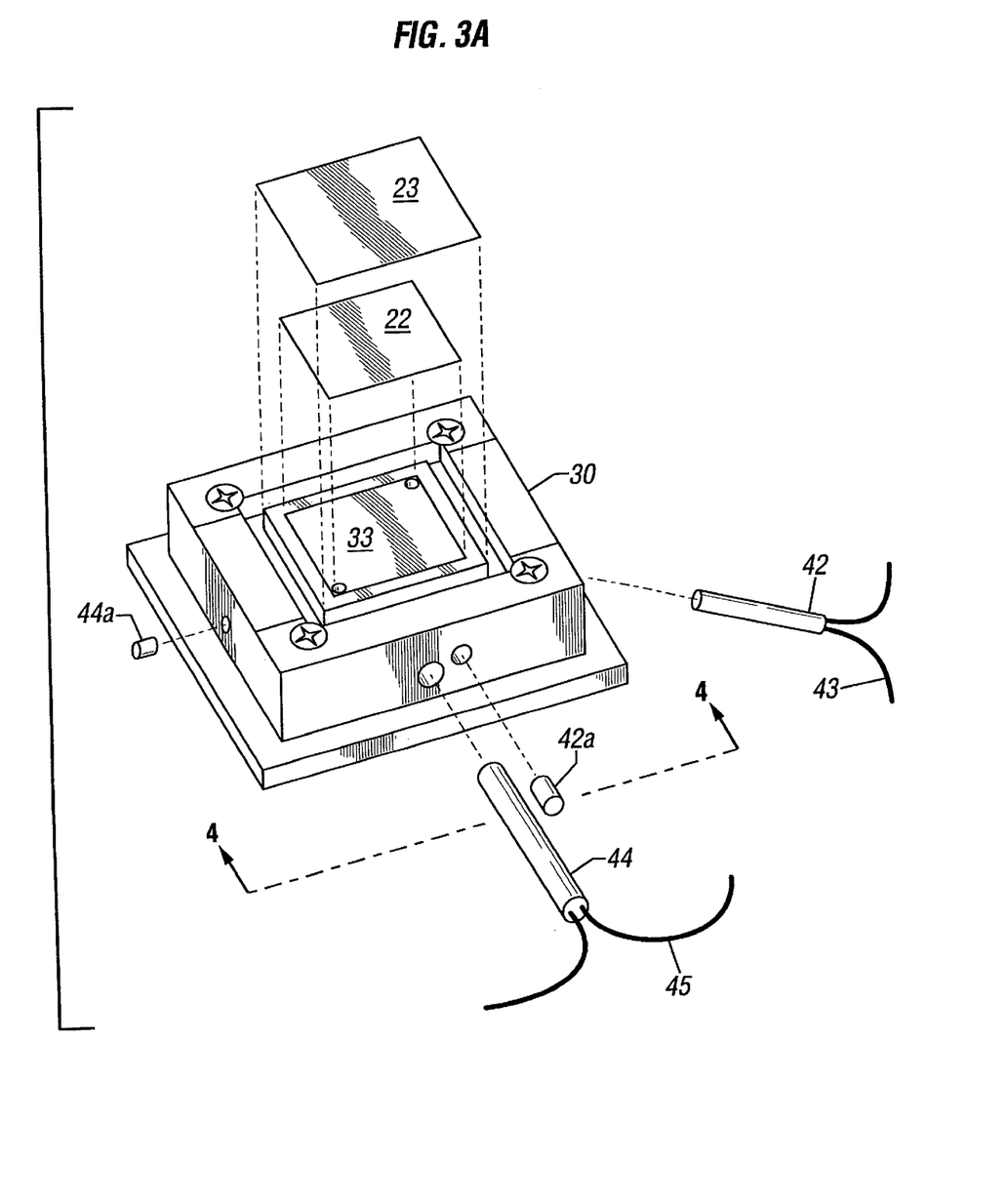
FIG. 3A is a perspective exploded view of the heat-removal portion of the socket of FIG. 1.
Figure 3B:
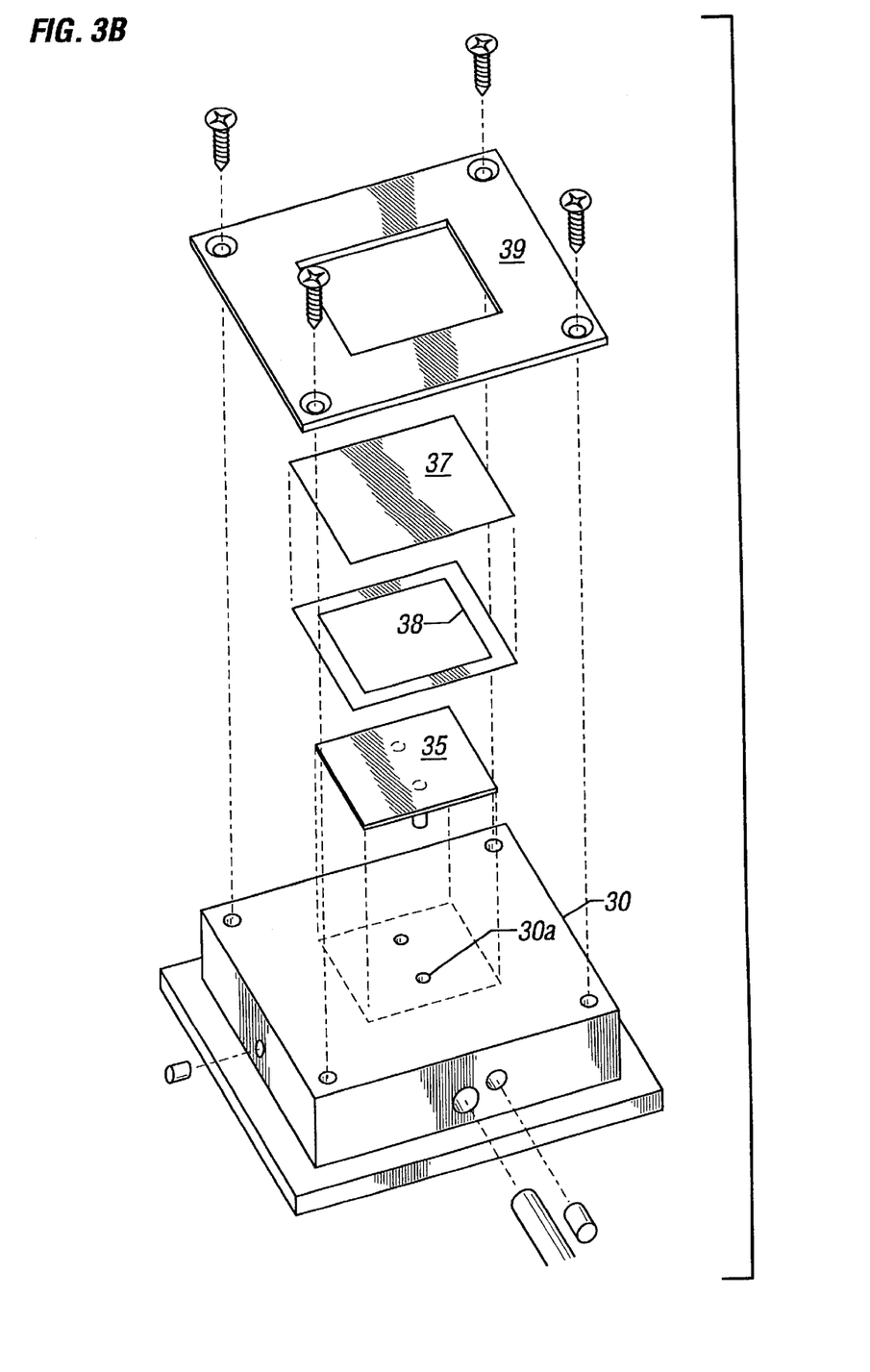
FIG. 3B is a perspective exploded view of an alternative embodiment of the heat-removal portion of the socket of FIG. 1.
Figure 4:
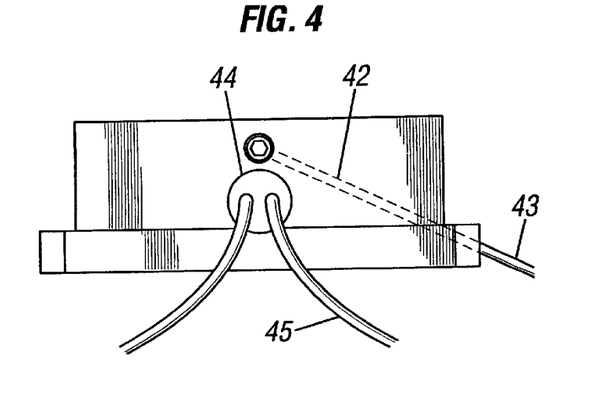
FIG. 4 is a side view taken along lines 4—4 of FIG. 3, showing internal components in phantom.

In the present system, this is accomplished by providing excess cooling capacity and simultaneously supplying make-up heat to individual DUTs. More specifically, the cooling system, described below is designed and operated so as to remove approximately 10 percent more heat from each socket than is generated by the hottest DUT. Referring now to FIGS. 3A and 4, each heat spreader 30 preferably includes a thermocouple 42 or other suitable temperature sensor embedded in the body of the heat sink, near its contact surface 33. Thermocouple 42 is preferably removable and replaceable and is connected to suitable signal processing equipment (not shown) by thermocouple leads 43. Thermocouple 42 can be any suitable thermocouple, such as are well known in the art. Thermocouple 42 is preferably held in place by a set screw 42a.

In addition, a small resistance heater or other type of heater 44 is also included in heat spreader 30. Heater 44 may be any suitable heater, so long as it is capable of a fairly rapid response time. Heater 44 is preferably positioned behind thermocouple 42 with respect to contact surface 33, so that thermocouple 42 senses the temperature at a point very near the surface of the DUT. Heater 44 is also preferably removable and replaceable and is connected to a power source by heater leads 45. The power applied to heater 44 is preferably controlled by the signal processing equipment in response to the output of thermocouple 42. At present, it is preferred that each heater 44 be capable of generating at least 30, more preferably at least 50 and most preferably at least 55 watts of heat. Heater 44 is preferably held in place by a set screw 44a.

Liquid Vapor Cooling System

Figure 5A:
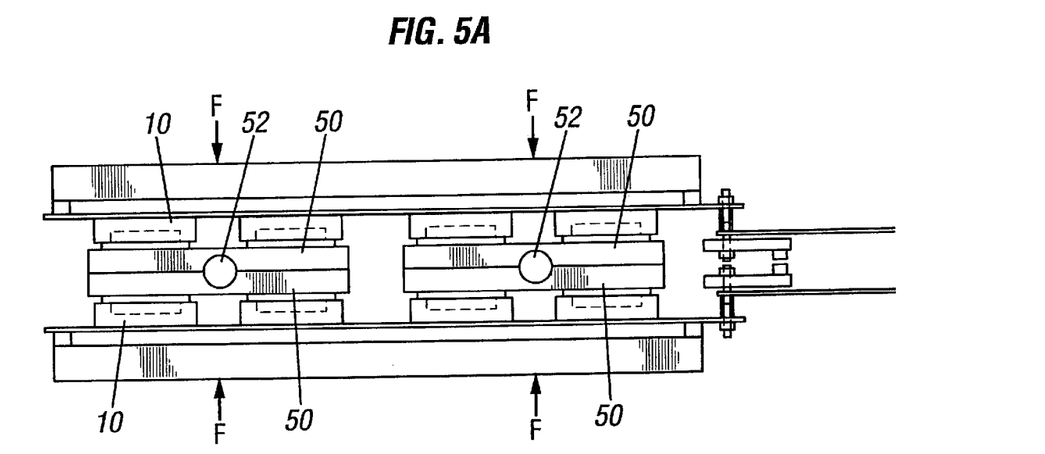
FIGS. 5A–B are top views of burn-in boards seated and unseated on corresponding heat sinks, respectively.
Figure 5B:
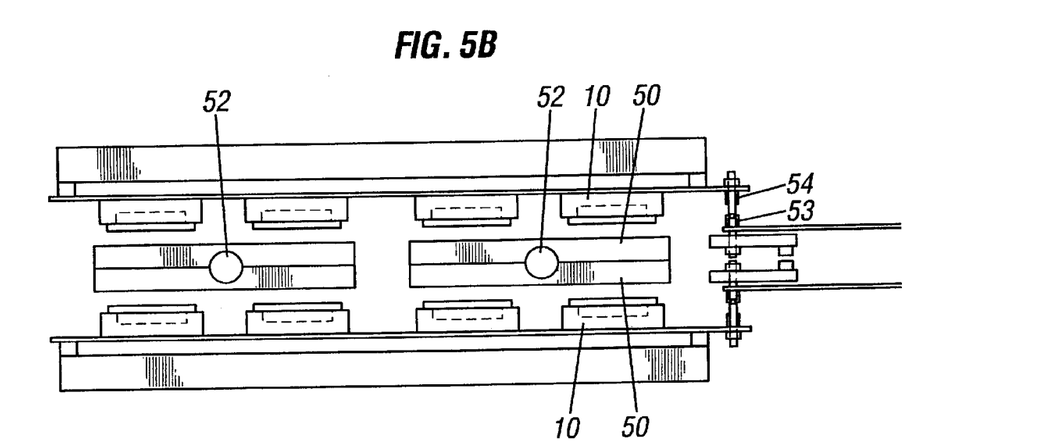

Referring now to FIGS. 5A–B, heat is conducted away from DUT by heat spreader 30, which is in turn cooled by heat sink 50. Each heat sink 50 cools a plurality of sockets. In a preferred embodiment, heat sink 50 includes a liquid-vapor (LV) duct 52 therethrough. LV duct 52 serves as a conduit for a cooling medium, such as but not limited to water (liquid and vapor). The water circulates through a closed loop (not shown) that includes duct 52, a reservoir, a heater, a controller and a mechanical device that makes both electrical contact between electrical connectors 53 and 54 and mechanical thermal contact simultaneously.

Heretofore, liquid-vapor cooling systems have been used for cooling burn-in devices for high power transmitters, silicon controlled rectifiers and the like. The principles involved in operation of an LV cooling system are set out in U.S. Pat. No. 3,756,903 to Jones, which is incorporated herein in its entirety. However, as discussed above, the handling, cost, and other considerations associated with those devices make previously known cooling LV systems unsuitable for cooling integrated circuit chips as in the present application.

Heretofore, it has always been necessary to provide a separate controller for each duct 52, so as to ensure that the cooling of one group of devices would not affect the cooling of another group of devices in the system. According the present invention, significant cost and space savings are realized by providing ducts 52 that are manifolded together in groups of at least two and preferably 4, thereby allowing an entire system of up to 72 sockets to operate with a single reservoir, heater and controller.

Figure 6:
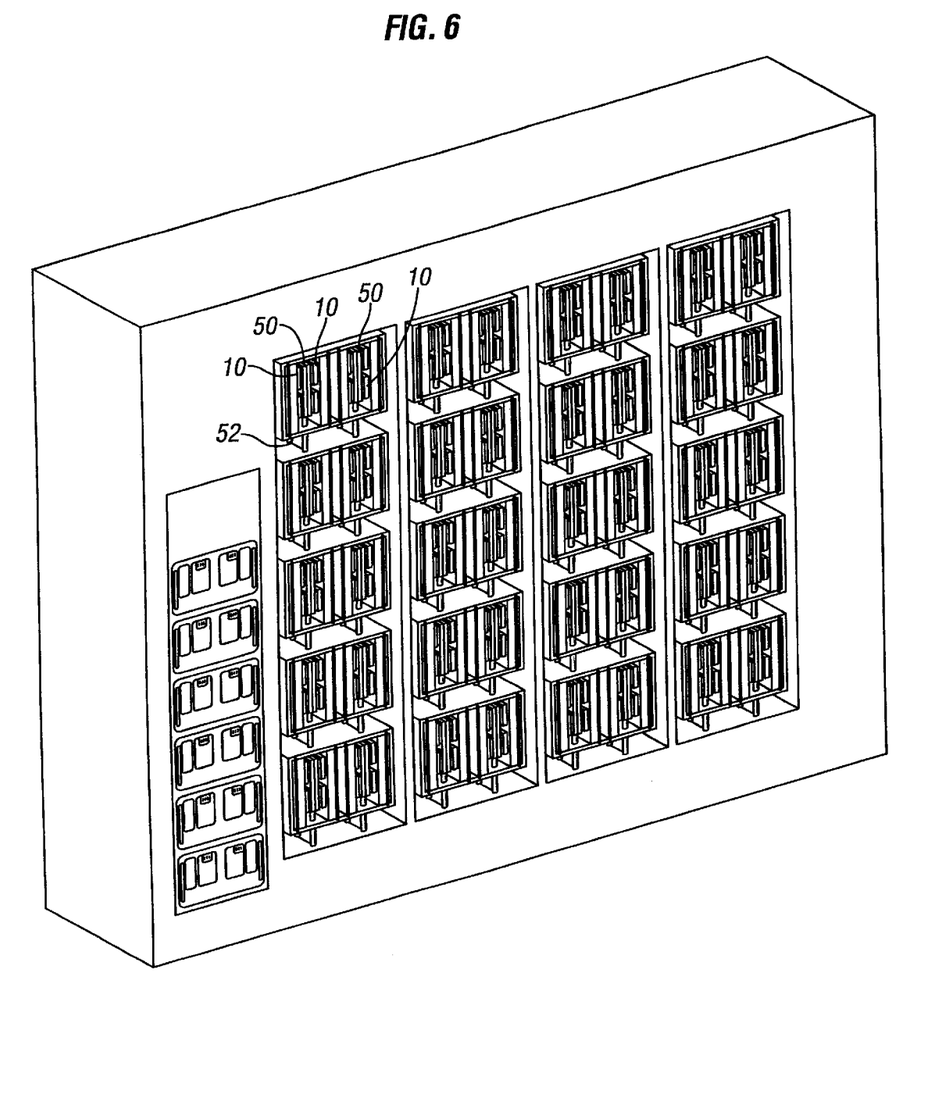
FIG. 6 is a perspective front view of an entire test system, showing multiple groups of sockets and multiple heat sinks.

Referring now to FIG. 6, it will be understood that the socket and heat sink combination can be repeated several times within a single burn-in system 100. According a preferred embodiment, LV ducts 52 are grouped and manifolded together so that they can be operated on a single system and controlled by a single controller. LV ducts 52 can be grouped so that all ducts from burn-in system 100 are controlled together, or can be grouped in subgroups containing less than all of the ducts.

Although the present system is described in terms of the preferred LV cooling system, it will be understood that any other cooling system can be used without departing from the scope of the present invention. For example, air, chilled water (such as in an LCU), or other cooling fluids can be placed in direct or indirect thermal contact with heat spreader 30, so as to carry away the desired amount of heat.

Operation

When it is desired to perform a burn-in operation, a DUT 40 is placed on socket base 12 within the area bounded by lip 17 so that the electrical contacts on the DUT align with the appropriate contacts 15 on socket base 12. The heat spreader 30 and the components affixed thereto are then lowered onto the base until lid 20 comes to rest on compression stop 16. Referring now to FIGS. 1 and 5A–B, a heat sink 50 is sandwiched between one or more pairs of opposed sockets 10 and the force F applied on the opposed sockets serves as the compression force on the components, including the DUT, within each socket. After each burn-in operation, the opposed sockets are withdrawn from contact with heat sink 50, allowing each socket to be opened and the DUT to be removed.

Heat spreader 30 is sized and shaped such that when the force F is applied to it by heat sink 50, heat pad 22 is pressed into good thermal contact with the upper surface of the DUT and springs 26 are slightly compressed. Heat pad 22 is compressed between the DUT and heat spreader 30, but is not compressed to the limit of its compressibility. Likewise, springs 26 are not compressed to the limit of their compressibility and thus serve to transmit a limited compression force from heat spreader 30 to the DUT via pressure plates 24. Hence, the application of force to the DUT is controlled within a desired range and any excess force is transmitted directly to the socket base via compression stop 16. At the same time, the compressed heat pad 22 forms a good thermal contact between the DUT and heat spreader 30, allowing heat spreader 30 and heat sink 50 to effectively remove all of the heat (30 watts or more) generated in the DUT during burn-in.

Like the applied force, the temperature of each DUT is precisely controlled within a predetermined, specified range during the burn-in operation. As stated above, this is accomplished by providing excess cooling capacity and then providing make-up heat as needed to individual DUTs. The LV system is set to remove from each socket more heat than the maximum amount of heat generated by any one of the DUTs. As each DUT is cooled, thermocouple 42 senses its temperature. If the temperature of a given DUT drops below the specified burn-in temperature range, the signal processor will cause heater 44 to provide a compensating amount of heat so as to maintain the temperature of the DUT within the desired range. It will be understood that this control loop can be accomplished by any suitable controller, including a microprocessor, and may include any suitable control algorithm, such as are known in the art.

EXAMPLE 1

Thermal Specs

Thermal specifications and operational details of one embodiment of a burn-in system 60 in accordance with the present invention are as follows:

Power handling: Each LVU can handle 2,500 watts of device dissipation. The standard test system with 8 LVU's can dissipate 20,000 watts. Each LCU can handle 5000 watts of device dissipation. The standard LCU test system with 8 LCU's can dissipate 40,000 watts.

In its highest power handling configuration with 4 DUTs per performance board, each DUT can dissipate up to 100 watts average power. Maximum device density per test system is 576 devices (12 devices per performance board, 6 performance boards per LVU, and 8 LVU's per test system, for a total of 48 boards containing 576 DUTs per test system). The system can be depopulated to allow for higher device power dissipation. The power supplies can deliver up to 75 watts of power to each device, and the LVU can handle 30 devices dissipating 75 watts each.

Preferred system density at 75 watts per device is 240, for the LVU. Preferred system density at 75 watts per device is 480 devices for an LCU.

In an LVU, if the average DUT power is less than 27 watts, then device density can be increased to 15 DUTs on each performance board. At this load, 15 devices per board with the same number of board positions yields 720 DUTs per test system.

The present system DUT power supplies are capable of supplying 75 watts of DC power to each DUT in high power mode, or to each pair of devices in lower power mode.

Board density: As mentioned above, performance board density varies with expected average device power. For devices dissipating up to 34 watts average power, 12 parts per performance board are allowed. For devices dissipating between 35 and 52 watts, 8 parts per performance board are allowed.

What is claimed is:

1. An apparatus for dissipating power from an integrated circuit, comprising:

a socket capable of receiving and supporting a DUT carrying the integrated circuit, said socket including electrical leads for connecting to corresponding leads on said DUT;

a heat sink in thermal contact with a cooling medium;

a heat spreader in thermal contact with said heat sink and with said DUT, said heat spreader including a thermal interface in releasable mechanical and thermal contact with the DUT in the socket, wherein said thermal interface is mechanically adjustable and includes an outer layer comprising a metal foil; and a heater and a thermocouple, said heater and said thermocouple being adjacent to said thermal interface, said heater being controlled in response to output from said thermocouple.

2. An apparatus for dissipating power from an integrated circuit, comprising:

a socket capable of receiving and supporting a DUT carrying the integrated circuit, said socket including electrical leads for connecting to corresponding leads on said DUT;

a heat sink in thermal contact with a cooling medium;

a heat spreader in thermal contact with said heat sink and with said DUT, said heat spreader including a thermal interface in releasable mechanical and thermal contact with the DUT in the socket, wherein said thermal interface comprises an amount of a low melting point metal contained in a foil skin; and a heater and a thermocouple, said heater and said thermocouple being adjacent to said thermal interface, said heater being controlled in response to output from said thermocouple.

3. An apparatus for dissipating power from an integrated circuit, comprising:

a socket capable of receiving and supporting a DUT carrying the integrated circuit, said socket including electrical leads for connecting to corresponding leads on said DUT;

a heat sink in thermal contact with a cooling medium;

a heat spreader in thermal contact with said heat sink and with said DUT, said heat spreader including a thermal interface in releasable mechanical and thermal contact with the DUT in the socket, wherein said thermal interface comprises an amount of a low melting point metal contained in a foil skin, wherein said foil skin has a perimeter that is sealed to said heat spreader; and a heater and a thermocouple, said heater and said thermocouple being adjacent to said thermal interface, said heater being controlled in response to output from said thermocouple.

4. An apparatus for dissipating power from an integrated circuit, comprising:

a socket capable of receiving and supporting a DUT carrying the integrated circuit, said socket including electrical leads for connecting to corresponding leads on said DUT;

a heat sink in thermal contact with a cooling medium;

a heat spreader in thermal contact with said heat sink and with said DUT, said heat spreader including a thermal interface in releasable mechanical and thermal contact with the DUT in the socket; and a heater and a thermocouple, said heater and said thermocouple being adjacent to said thermal interface, said heater being controlled in response to output from said thermocouple.

5. An apparatus for dissipating power from an integrated circuit, comprising:

a socket capable of receiving and supporting a DUT carrying the integrated circuit, said socket including electrical leads for connecting to corresponding leads on said DUT;

a heat sink in thermal contact with a liquid-vapor cooling system;

a heat spreader in thermal contact with said heat sink and with said DUT, said heat spreader including a thermal interface in releasable mechanical and thermal contact with the DUT in the socket; and a heater and a thermocouple, said heater and said thermocouple being adjacent to said thermal interface, said heater being controlled in response to output from said thermocouple.

* * * * *